United States Patent [19]
Houston

[11] Patent Number: 6,096,612
[45] Date of Patent: Aug. 1, 2000

[54] INCREASED EFFECTIVE TRANSISTOR WIDTH USING DOUBLE SIDEWALL SPACERS

[75] Inventor: Theodore W. Houston, Richardson, Tex.

[73] Assignee: Texas Instruments Incorporated, Dallas, Tex.

[21] Appl. No.: 09/070,213

[22] Filed: Apr. 30, 1998

Related U.S. Application Data

[60] Provisional application No. 60/044,257, Apr. 30, 1997.

[51] Int. Cl.[7] .......................... H01L 21/336; H01L 21/76
[52] U.S. Cl. ........................ 438/296; 438/297; 438/298; 438/424; 438/425
[58] Field of Search .................................. 438/296, 297, 438/298, 424, 425, 426, 433

[56] References Cited

U.S. PATENT DOCUMENTS

| | | |
|---|---|---|
| H204 | 2/1987 | Oh et al. .................................. 156/648 |
| 4,276,099 | 6/1981 | Keen et al. ............................. 148/187 |
| 4,570,325 | 2/1986 | Higuchi .................................... 29/576 |
| 5,068,202 | 11/1991 | Crotti et al. ............................. 437/67 |
| 5,385,853 | 1/1995 | Mohammad . |
| 5,385,861 | 1/1995 | Bashir et al. . |
| 5,387,538 | 2/1995 | Moslehi . |
| 5,395,790 | 3/1995 | Lur . |
| 5,399,520 | 3/1995 | Jang . |
| 5,407,837 | 4/1995 | Eklund . |
| 5,411,913 | 5/1995 | Bashir et al. . |
| 5,424,240 | 6/1995 | Han . |
| 5,436,190 | 7/1995 | Yang et al. . |
| 5,453,395 | 9/1995 | Lur . |
| 5,472,902 | 12/1995 | Lur . |
| 5,474,953 | 12/1995 | Shimizu et al. . |
| 5,492,853 | 2/1996 | Jeng et al. . |
| 5,518,950 | 5/1996 | Ibok et al. . |
| 5,599,722 | 2/1997 | Sugisaka et al. ........................ 437/21 |
| 5,674,775 | 10/1997 | Ho et al. .................................. 437/67 |
| 5,753,561 | 5/1998 | Lee et al. ................................ 438/424 |
| 5,795,811 | 8/1998 | Kim et al. .............................. 438/404 |
| 5,874,317 | 2/1999 | Stolmeijer ................................ 437/67 |

OTHER PUBLICATIONS

Tai–su Park, Yui Gyun Shi, Han Sin Lee, Moon Han Park, Sang Dong Kwon, Ho Kyu Kang, Young Bum Koh and Moon Yong Lee, "Correlation Between Gate Oxide Reliability and the Profile of the Trench Top Corner in Shallow Trench Isolation (STI)", IEDM 96–747, pp. 29.6.1–29.6.4.

*Primary Examiner*—Richard Booth
*Assistant Examiner*—Walter L. Lindsay, Jr.
*Attorney, Agent, or Firm*—Wade James Brady, III; Frederick J. Telecky, Jr.

[57] ABSTRACT

A structure and a method for fabricating integrated circuits are disclosed in which narrow trench isolation structures (36) are formed between active regions (38) of an integrated circuit (10). A silicon nitride layer is deposited, patterned and etched to provide nitride mask (16) having spaces (20) which are preferably no larger than the minimum photolithography spacing limits. Single sidewall oxide spacers (24) are formed on the sidewalls of the nitride mask by depositing a conformal coating of oxide and then applying an anisotropic etch, leaving the oxide spacers (24) of approximately 100 to 500 Angstroms thickness on the sidewalls of the nitride mask (16). Isolation trenches (26) are etched into a silicon substrate (12) in the spaces between adjacent ones of the oxide spacers (24). The oxide spacers (24) are then removed without removing the nitride mask (16), leaving ledges, or shelf regions (28), of the substrate (12) in the spaces between the trenches (26) and the nitride mask (16). Channel stops (30) are implanted into the shelf regions (28). Oxide plugs (34) are formed within the trenches (26). Double sidewall spacers, such as nitride spacers (114) and oxide spacers (118), may be used to reduce the width of the trench isolation structure (140). The edges (66) of the isolation trench (60) may also be rounded.

29 Claims, 8 Drawing Sheets

INCREASED EFFECTIVE TRANSISTOR WIDTH USING DOUBLE SIDEWALL SPACERS

This application claims priority under 35 USC § 119(e)(1) of provisional application Ser. No. 60/044,257 filed Apr. 30, 1997.

BACKGROUND OF THE INVENTION

Integrated circuit chip manufacturers fabricate advanced semiconductor devices by different combinations of processes such as sequentially forming metals, oxides, doped semiconductor and other materials in layers usually thinner than one micrometer (micron) and, then, etching away predetermined portions of the thin layers from the surface of the semiconductor substrate. In these techniques, manufacturing process control and fabrication tolerance are important considerations. Moreover, as the integrated circuit packing density and chip size increase with each new technology generation, ensuring process control and satisfying fabrication tolerances become even more important requirements. Many conventional fabrication techniques and device structures, however, cannot easily meet these requirements.

One important aspect of forming semiconductor devices is the ability to electrically isolate each active component from other active components on the integrated circuit. While this is a critical consideration in Very-Large-Scale Integrated (VLSI) circuits and Ultra-Large-Scale Integrated (ULSI) circuits, traditional isolation structures are not easily scalable for use in sub-half micron VLSI and ULSI technologies. There are numerous reasons why the conventional isolation techniques have not proven scalable down to the sub-half micron regimes. For example, the widely used isolation method known as local oxidation of silicon (LOCOs) is an isolation technique used to form isolation structures in integrated circuit devices. The LOCOs isolation, however, suffers from a limitation know as formation of what is often called "bird's beak" regions at the isolation edge regions of active regions of the devices which limits the minimum spacing between active regions of integrated circuit devices, increasing the minimum spacing.

Trench isolation is often used to isolate the active regions of integrated circuit devices. Isolation trenches are etched into field regions which extend between active regions of the integrated circuits, and then dielectric plugs are formed within the isolation trenches to electrically isolate the active regions. Channel stops may also be formed by implanting dopant impurities into regions of semiconductor substrates which are adjacent to the isolation trenches in which the dielectric plugs are formed. For example, a P+ channel stop may be formed in a P-type substrate by implanting boron. Channel stops increase the effective minimum spacing between the active regions of integrated circuit components by decreasing the effective widths of the active areas.

Isolation trenches are initially formed with sharp, squared edges where the sidewalls of the trench meet the outer surface of the substrates. Squared edges cause two problems. First, squared edges create electric field concentrations such that dielectric breakdown is more likely than if the edge of the trenches were rounded. A second problem is that gate oxide layers are thinned when the squared edges of the isolation trenches are encountered at the edge of a transistor adjacent to the isolation trenches. The gate oxide layers are more likely to breakdown where they are thinned at the squared edges of the isolation trenches.

Current photolithography limits restrict the spacing between active regions which are separated by trench isolation field oxides. Present photolithography limits restrict the minimum size of windows of masking materials, which are deposited on top of substrates to define active regions, to approximately 0.3 microns. Channel stops further increase the effective spacing between active areas by encroaching into the active area, which decreases the effective active area width. Increased minimum spacing requirements result in a reduction of the number of components which may be formed of a single integrated circuit, reducing the effective component width where a preselected number of components are to be formed in a particular region of the integrated circuits.

For bulk silicon integrated circuits with LOCOS isolation, the moat to moat spacing has generally been limited by process and electrical considerations rather than the lithography limits. In contrast, for SOI (Silicon-On-Insulator) integrated circuits with mesa isolation, and more recently for bulk integrated circuits with shallow trench isolation, the moat to moat spacing is approaching lithographic limits. The lithographic equipment and processes to achieve sub-micron dimensions become increasingly expensive, such as deep UV lithography and phase-shift masks. Therefore, there is a need for processes to fabricate moat to moat spacing at dimensions smaller than the limits of the lithographic equipment used. This would allow achievement of moat spacings smaller than the state of the art lithography limits. Alternatively, this would allow the use of less expensive lithographic equipment and procedures for definition of the moat pattern.

SUMMARY OF THE INVENTION

The present invention disclosed and claimed herein comprises a structure and method for fabricating an integrated circuit in which a narrow trench isolation region is formed between active regions of adjacent electronic components of the integrated circuit. A silicon nitride layer is deposited, patterned and etched to provide a nitride having some spaces that are substantially at the photolithographic limit. Sidewall spacers are then formed on the sidewalls of the nitride mask by depositing a conformal coating of silicon dioxide (oxide) and then applying an anisotropic etch, to leave a single sidewall spacer of approximately 100 to 500 Angstroms thickness on each of the sidewalls of the nitride mask. Trenches are then etched into the silicon substrate in the spaces between adjacent ones of the oxide sidewall spacers, such that some of the trenches are narrower than the conventional photolithography limits. An etch is then applied to remove the oxide sidewall spacers without removing the nitride mask, leaving ledges of the substrate in the spaces between the trenches and the nitride mask. Channel stops are then implanted into regions of the silicon substrate which are beneath the ledges and adjacent to the trenches. Oxide plugs are then deposited within the trenches to separate the active regions between adjacent circuit components, with the channel stop implants disposed adjacent to the trenches and the oxide plugs.

In another aspect of the present invention, dual sidewall spacers are used to determine the width of the isolation trenches. First, a pad oxide layer and then a silicon nitride layer are provided on a surface of the substrate. The nitride layer is patterned and etched to provide a nitride mask and define trench isolation regions. A conformal silicon nitride layer is deposed on the substrate and the nitride mask, and then an anisotropic etch is applied to the conformal silicon nitride layer to form single nitride sidewall spacers on the sidewalls of the nitride mask. The nitride sidewall spacers are approximately 100 Angstroms to 500 Angstroms thick.

Then, a conformal layer of silicon dioxide is deposited across the nitride and the trench isolation regions, and a second anisotropic etch is applied to form single oxide sidewall spacers alongside of and adjacent to the nitride spacers. Isolation trenches are then etched into the silicon substrate to a depth of approximately one-half micron. The oxide sidewall spacers are then removed to expose ledges of the substrate which extend between the nitride spacers and the trenches. Optionally, processing may be done to round the corner of the silicon mesa at the trench edge. Optionally, channel stops are then implanted into the ledges and adjacent to the sidewalls and the lower surface of the isolation trenches. Oxide plugs are deposited within the isolation trenches, and then the nitride sidewall spacers and the nitride mask are removed, leaving the oxide plug disposed within the isolation trenches and overlapping the mesa edge to define the field and active regions. The integrated circuit may then be fabricated according to conventional fabrication techniques. Optionally, a portion of the oxide plug will remain overlapping the mesa edge.

In another aspect of the present invention, sidewall spacers are used to reduce the width of the isolation trenches, and special processing is done to round the corner of the active region at the trench edge. First, a pad oxide layer and then a silicon nitride layer are provided on a surface of the substrate. The nitride layer is patterned and etched to provide a nitride mask and define trench regions. A conformal silicon nitride layer is deposited on the substrate and the nitride mask, and then an anisotropic etch is applied to the conformal silicon nitride layer to form nitride sidewall spacers on the sidewalls of the nitride mask. The width of the sidewall spacers determines the amount by which the trench region is narrowed, and typically may be 50 nm wide. Isolation trenches are then etched into the silicon substrate to a depth of approximately one-half micron. Optionally, an undercut etch is performed to remove a portion of the pad oxide which extends adjacent to the isolation trenches, and a layer of oxide is then grown such that the corners of the isolation trenches are rounded. Optionally, channel stops are implanted into the bottom of the trenches. Oxide plugs are deposited within the isolation trenches. Optionally, this is done by deposition of an oxide followed by a chemomechanical polish (CMP) to remove the oxide over the nitride. The nitride mask and sidewall spacers are removed, leaving the oxide plugs disposed within the trenches to define the field and active regions. The integrated circuit may then be fabricated according to conventional techniques.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
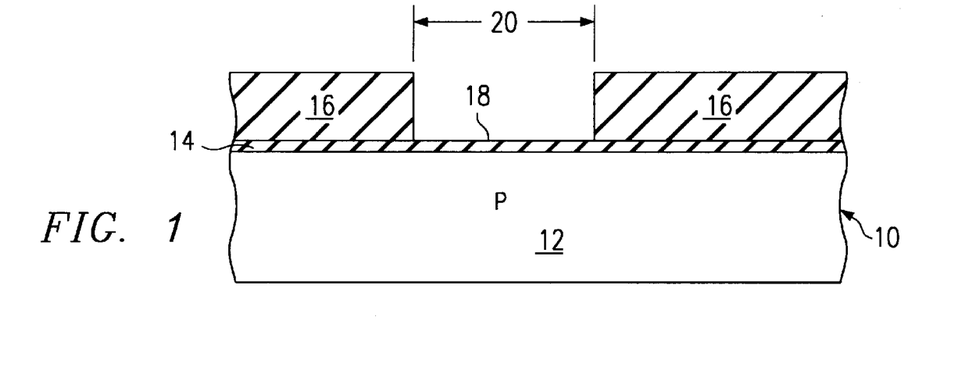
FIG. 1 illustrates a sectional view of a semiconductor substrate being fabricated into an integrated circuit after having a pad oxide and nitride mask formed thereon.

Referring now to FIG. 1, there is illustrated a cross-sectional view of an integrated circuit 10 being fabricated from a semiconductor substrate 12, which is preferably formed of silicon. A pad silicon dioxide 14 (oxide) is deposited or grown on the substrate 12. A layer of silicon nitride (nitride) is then deposited on the pad oxide 14 by a chemical vapor deposition (CVD) technique. This layer is then patterned and etched according to conventional photolithographic techniques to define a nitride mask 16. An isolation trench region 18 is defined in the spacing of a window 20 in the nitride layer mask 16. Currently, conventional photolithography techniques limit the window 20 to a spacing, or gap, between mesas of the nitride layer 16 having a minimum distance of approximately three-tenths of a micrometer (0.3 microns). However, as technology advances, this will decrease.

Figure 2:
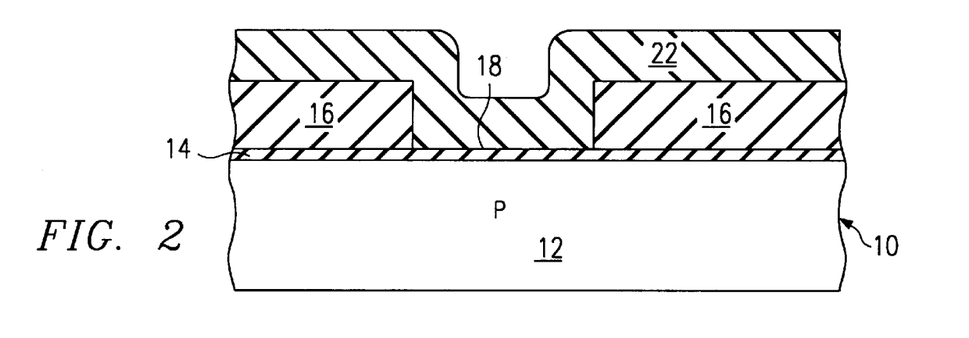
FIG. 2 illustrates a cross-sectional view of the partially fabricated integrated circuit after a conformal layer of oxide has been deposited thereon.

Referring now to FIG. 2, there is illustrated a cross-sectional view of the integrated circuit 10. A conformal layer of oxide 22 is deposited over the nitride layer 16 and the portion of pad oxide layer 14 which extends in the gap is in the nitride layer 16. Oxide layer 22 is deposited by low pressure chemical vapor deposition (LPCVD) on the pad oxide 14 and the nitride mask layer 16.

Figure 3:
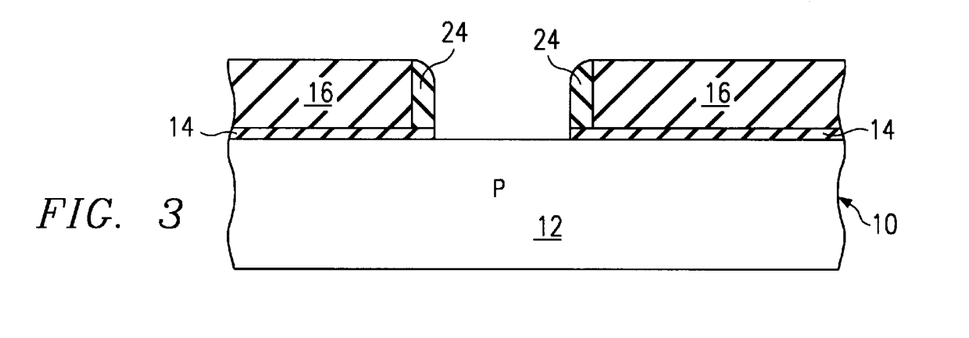
FIG. 3 illustrates a cross-sectional view of the partially fabricated integrated circuit after an anisotropic etch process is performed to provide oxide spacers on the sidewalls of the nitride mask.

Referring now to FIG. 3, there is illustrated a cross-sectional view of the partially fabricated integrated circuit 10 of FIG. 2 after applying an anisotropic etch to vertically etch the horizontal surfaces of the conformal layer of the oxide 22, leaving a portion of the oxide 22 on all vertical surfaces to provide spaced apart, oxide sidewall spacers 24. The sidewall spacers 24 preferably have a width which ranges from 100 to 500 Angstroms, such that the gap between the two adjacent oxide spacers 24 is equal to the difference between the spacing of the sidewalls of the window 20, approximately 0.3 microns, and the combined thickness of the two oxide spacers 24, approximately 200 to 1,000 Angstroms. It should be noted that in other embodiments of the present invention, other materials such as nitride or polysilicon can be used to form the sidewall spacers in place of the oxide spacers 24.

Figure 4:
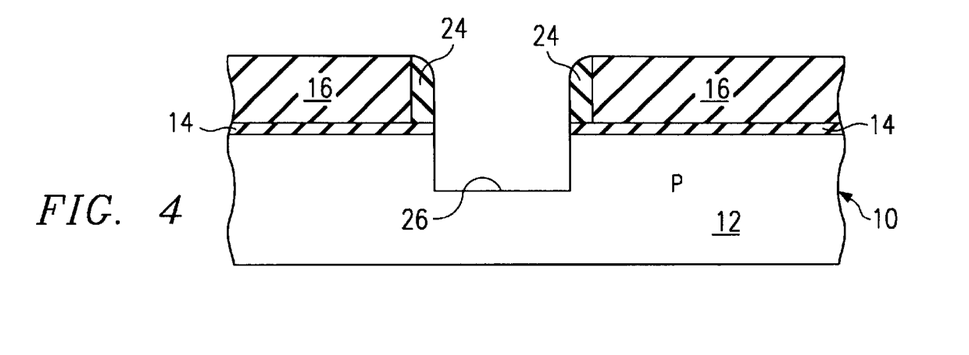
FIG. 4 illustrates a cross-sectional view of the partially fabricated integrated circuit after a trench etch to form a trench therein.

Referring now to FIG. 4, there is an illustrated a cross-sectional view of the integrated circuit 10 during fabrication. A trench 26 is etched into the substrate 12 by etching through the open portion of the pad oxide 14 disposed between the spacers 24, and of the oxide spacers 24. The trench is typically etched to a depth of approximately 0.5 microns.

Figure 5:
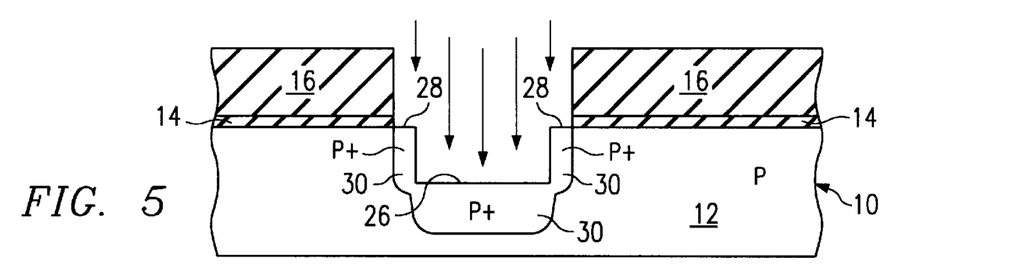
FIG. 5 illustrates a cross-sectional view of the partially fabricated integrated circuit as channel stop implants are being formed therein.

Referring now to FIG. 5, there is illustrated a cross-sectional view of the integrated circuit 10 as channel stops 30 are being implanted after removal of the sidewall spacers 24. The sidewall oxide spacers 24 are removed by a wet etch process. Removal of the oxide sidewall spacers 24 and the portion of the pad oxide 14 which was previously disposed beneath the oxide sidewall spacers 24 exposes shelf regions 28, which define ledges on the surface of the substrate 12 which are adjacent to the trench 26. The channel stops 30 are then formed in the portion of the substrate 12 which is disposed beneath the trench 26, and in the portion of the substrate 12 which is adjacent to the sidewalls of the trench 26 and beneath the ledges 28 to further isolate drain/source regions of an N-channel transistor. For an N-channel transistor, P+ type channel stops are formed, preferably utilizing boron that is implanted. In isolation regions which are adjacent to P-channel transistors, N-type channel stops are formed, preferably of implanted arsenic or phosphorous. Preferably, a double implant of boron would be performed at two different energy levels for N-channel transistors. In the preferred embodiment, the first implant would be at a dose of 2.5 E11 ion/cm$^2$, at an energy level of 430 KeV, to provide an impurity concentration of approximately 1.0 E17 ion/cm$^3$. Then, the second implant of the boron would be performed at a dose of 2.5 E12 ion/cm$^2$, at an energy level of 120 KeV, to provide a concentration of impurities of 1.0 E18 ion/cm$^3$. This would effectively distribute the dopants at different levels beneath the surface with a retrograde profile. Optionally, a channel stop can be implanted into the bottom of the trench prior to removing the sidewall layers, and then the sidewall layers removed and the channel stop implants performed in the exposed shelf Further, there could be performed an angled implant into the walls of the trench. For Silicon-on-Insulator (SOI) technology, only a single channel stop implant at the edge would be sufficient. Further, oxides may be formed on these surfaces prior to the implants.

Figure 6:
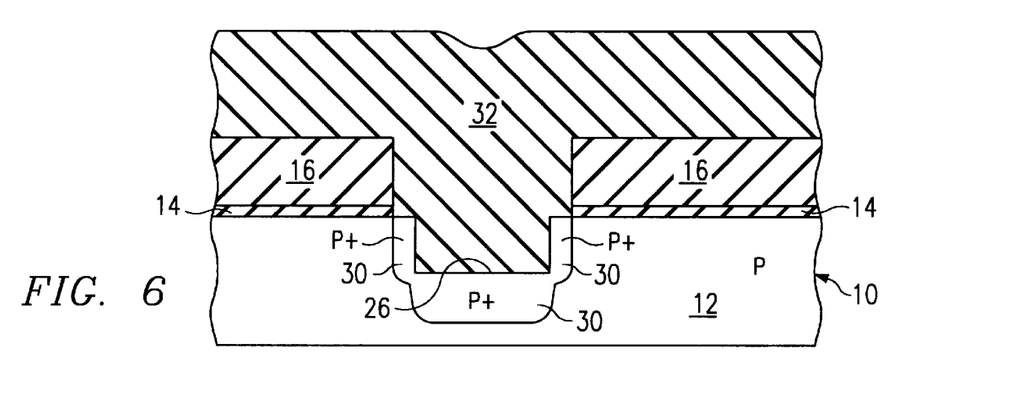
FIG. 6 illustrates a cross-sectional view of the partially fabricated integrated circuit after a layer of oxide has been formed thereon and within the trench.

Referring now to FIG. 6, there is illustrated a cross-sectional view of the integrated circuit 10 during the fabrication process. After the channel stops 30 have been formed, a layer of oxide 32 is grown and deposited within the trench 26 and above the nitride mask 16. Optionally, the oxide growth may be done prior to the channel stop implant. As a further option, oxide can be grown in the trench with the oxide spacers 24 still in place. Oxide growth either with the oxide spacer in place or with it removed, will give better corner rounding than oxidation with a nitride cover to the edge of the trench because of the combined effects of the pliancy of covering material and the availability of oxygen at the corner. The oxide layer 32 is preferably deposited by an LPCVD process. Optionally, other dielectrics may be used.

Figure 7:
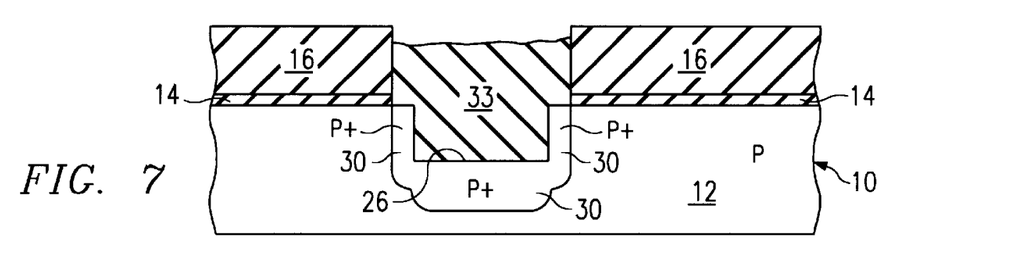
FIG. 7 illustrates a cross-sectional view of the partially fabricated integrated circuit after the surface thereof has been polished by a CMP process.

Referring now to FIG. 7, there is illustrated a cross-sectional view of the integrated circuit 10 during the fabrication process. The oxide layer 32 and the nitride mask layer 16 are polished by a chemical mechanical polishing process (CMP). This removes the portion of the layer 32 over the upper surface of the layer 16, leaving a portion 33 within the trench 26.

Figure 8:
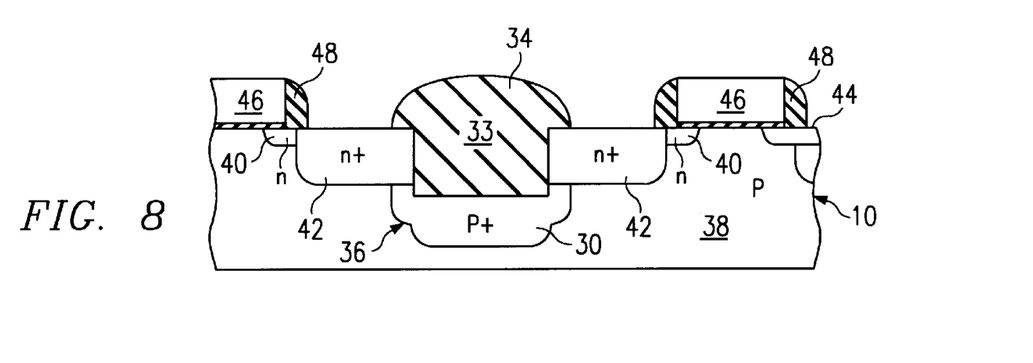
FIG. 8 illustrates a cross-sectional view of the partially fabricated integrated circuit during the fabrication process after the nitride mask and pad oxide layer have been removed from the substrate and transistors have been formed in active regions thereof.

Referring now to FIG. 8, there is illustrated a cross-sectional view of the partially fabricated integrated circuit 10 after the nitride mask layer 16 and the pad oxide layer 14 have been removed from the substrate 12 with a wet etch process. Then, the active regions are processed in a conventional manner with a plug 34 of dielectric material formed of the oxide 33 disposed in the isolation moat 26, or trench 26. A narrow trench isolation structure 36 is thus formed between the active regions 38 of the integrated circuit 10, and includes the plug 34 of the oxide 32 and the channel stops 30. Optionally, a portion of plug 34 overlaps the corner of the trench, as shown.

Further processing is performed by a self aligned process to form N+Source/drain regions 40 and 42, a gate oxide layer 44 and gate electrodes 46. The gate oxide layer 44 is grown on the substrate 12 to a thickness of between 40–60 Angstroms. The gate electrodes 46 will be formed by depositing a conformal layer of polysilicon, and then patterning and etching the polysilicon layer in selected regions to define the gate electrodes 46. Medium Doped Drain (MDD) implants 40 are then formed by ion implantation of N-type dopants, preferably phosphorous. Oxide sidewall insulators will then be formed by depositing a conformal layer of oxide, and then anisotropically etching the conformal layer of oxide to remove the oxide from substantially horizontal surfaces. After the sidewall oxide spacers 48 are formed, a high energy source/drain implant of arsenic is preferably performed to provide Source/drain regions 42 by implanting arsenic at a dose of 2.5 E12, at an energy level of 80 Kev, to provide a concentration of 1.0 E22/cm$^3$.

Figure 9:
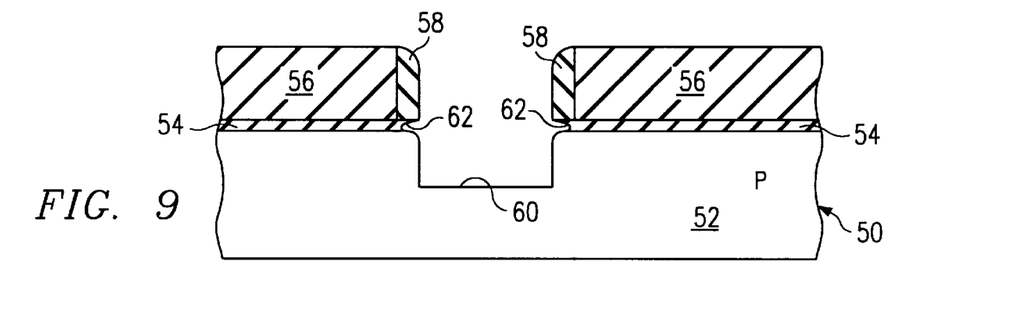
FIG. 9 illustrates a cross-sectional view of a second partially fabricated integrated circuit after a trench etch and an undercut etch have been performed.

Referring now to FIG. 9, there is illustrated a cross-sectional view of a partially fabricated integrated circuit 50 made according to a first alternative embodiment of the present invention. As depicted in FIG. 9, the partially fabricated integrated circuit 50 has been, in general, fabricated according to the steps depicted and described above in FIGS. 1 through 4 to provide a pad oxide 54 and a nitride mask 56 on substrate 52. Nitride sidewall spacers 58 are preferably formed on the sidewalls of nitride mask 56 which are adjacent to the gap therein, according to the steps set forth above for the sidewall spacers 24 in reference to FIGS. 2 and 3 utilizing a conformed layer of nitride rather than oxide. A trench 60 has been etched into the substrate 52 to a depth of approximately 0.5 microns, according to the procedure described above for the trench 26 of the integrated circuit 10 in reference to FIG. 4. Then, as depicted in FIG. 9, an undercut etch that is selective to oxide is performed to define undercuts 62 which are formed into the pad oxide 54 beneath the nitride sidewall spacers 58.

Figure 10:
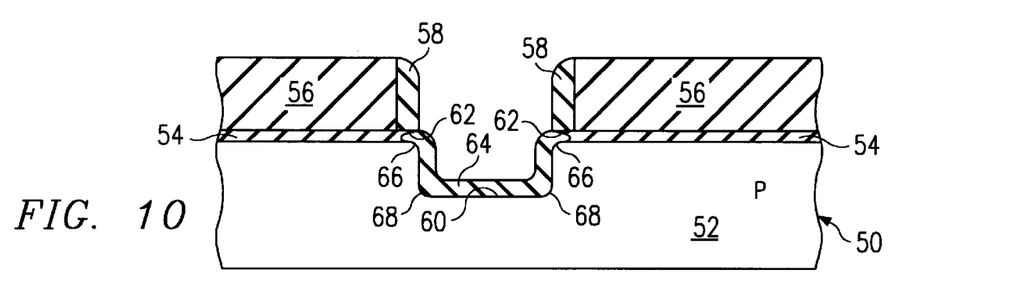
FIG. 10 illustrates a cross-sectional view of the second partially fabricated integrated circuit after an oxide layer has been formed on the exposed sidewalls and bottom of the trench.

Referring now to FIG. 10, there is illustrated a cross-sectional view of the partially fabricated integrated circuit 50 after a layer of oxide 64 has been grown on the exposed sidewalls and bottom portion of the trench 60. The oxide 64 is also grown on the portion of the substrate 52 which is adjacent to the outer corners 66 and the undercuts 62. A portion of the substrate 52 is consumed by growing the oxide 64, such that the outer corners 66 have exterior profiles which are rounded, having a substantially smooth, convex shape. Additionally, portions of the substrate 52 which are adjacent to the inner corners 68 of the trench 60 are consumed such that the inner corners 68 have profiles which are rounded to have a substantially smooth, concave shape. This "rounding" will effectively increase the gate oxide thickness of later formed transistors and also decrease the electric field at the corners.

Figure 11:
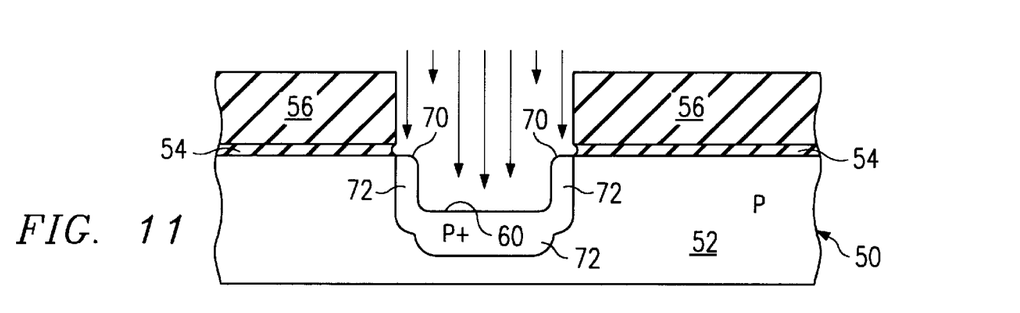
FIG. 11 illustrates a cross-sectional view of the second partially fabricated integrated circuit as channel stops are being implanted in regions of the substrate which are adjacent to the trench.

Referring now to FIG. 11, there is cross-sectional view of the integrated circuit 50 during the fabrication process. First, the nitride sidewall spacers 58 and the oxide layer 64 are removed by a wet etch process. Optionally, the oxide layer 64 may be left in place and the implant performed therethrough. The nitride etch is a timed etch, and the amount removed may be optionally less than, equal to or greater than the original sidewall spacer thickness. Removal of the nitride sidewall spacers 58 and optionally the oxide layer 64 exposes shelves, or ledges, 70 having peripheral edges at the outer corners 66 with a smoothly rounded, convex shape. Channel stops 72 are then formed by ion implantation of boron at two energy levels according to the procedure described above in reference to the channel stops 30 and FIG. 5. The etchback of the nitride and the channel stop implant 72 are optional. A further option, not shown, is to do an angled implant into the region 72. If the nitride mask 56 is at the photolithographic spacing limit, then the channel stops 72 and the trench 60 have a combined overall width which is not substantially greater than the photolithographic spacing limit.

Figure 12:
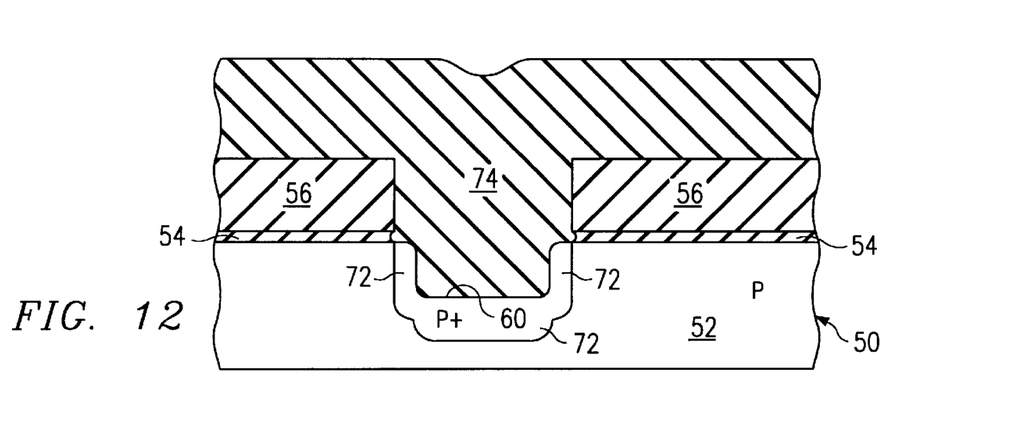
FIG. 12 illustrates a cross-sectional view of the second partially fabricated integrated circuit after a layer of oxide has been formed within the trench and upon the nitride mask.

Referring now to FIG. 12, there is illustrated a cross-sectional view of the partially fabricated integrated circuit 50 during the fabrication process. An oxide layer 74 has been deposited within trench 60 and on the surface of the nitride mask 56 by the LPCVD process described above for the oxide 32 in reference to FIG. 6.

Figure 13:
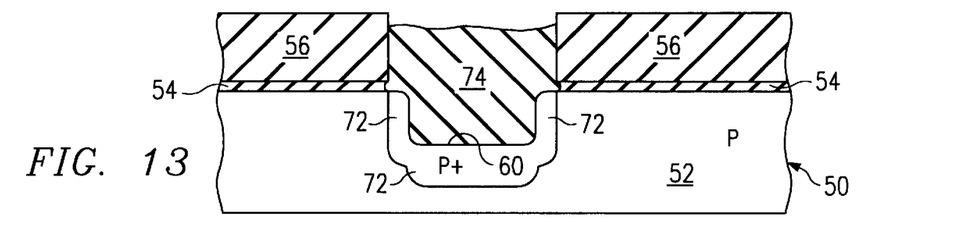
FIG. 13 illustrates a cross-sectional view of the second partially fabricated integrated circuit after the surface thereof has been polished by a CMP process.

Referring now to FIG. 13, there is illustrated a cross-sectional view of the partially fabricated integrated circuit 50 during the fabrication process. The circuit 50 is depicted after having been polished by the CMP process described above for the integrated circuit 50 in reference to FIG. 7.

Figure 14:
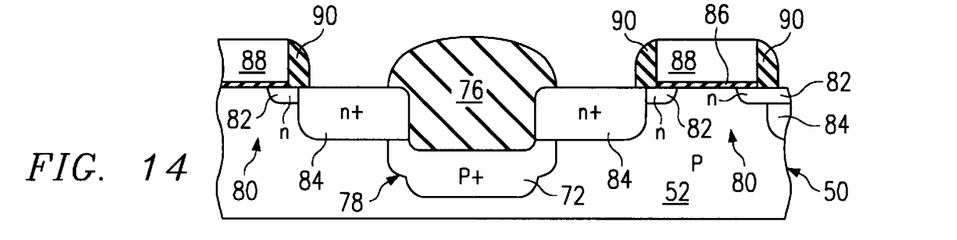
FIG. 14 illustrates a cross-sectional view of the second partially fabricated integrated circuit after a nitride mask and pad oxide have been removed, and transistors have been formed in the active regions thereof.

Referring now to FIG. 14, there is illustrated a cross-sectional view of the partially fabricated integrated circuit 50 after a nitride mask 56 and the pad oxide 54 have been removed, and an oxide layer 74 has been subjected to processing such that it provides an oxide plug 76 of dielectric material. A narrow trench isolation structure 78 is thus defined by the oxide plug 76 and the channel stops 72 between active regions 80 of the integrated circuit 50. Source/drain implants 82 and 84 are formed by a self-aligned process which is described above for the integrated circuit 10 in reference to FIG. 8, to form a gate oxide layer 86, gate electrodes 88, Source/drain implants 82, Sidewall spacers 90 and Source/drain implants 84.

Figure 15:
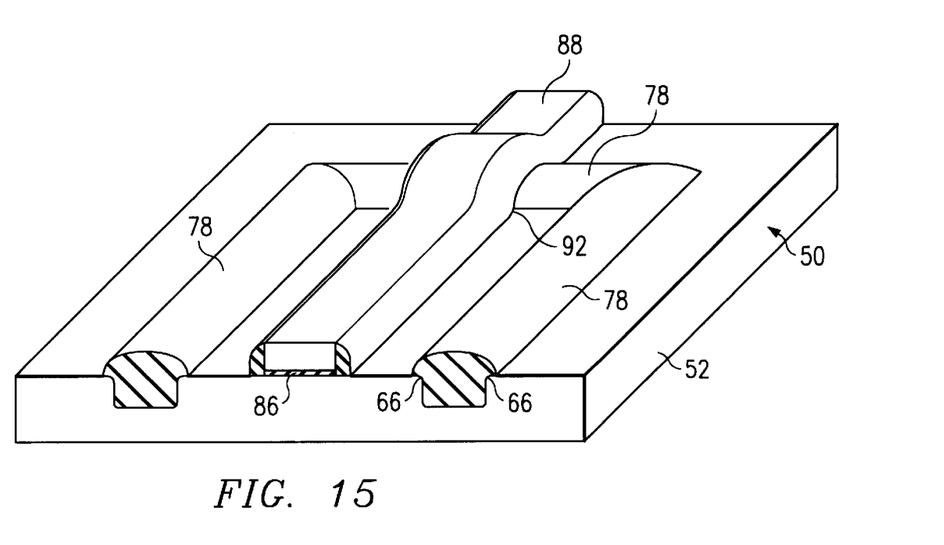
FIG. 15 illustrates a partially sectioned perspective view of the second integrated circuit after one of the gate electrodes is formed thereon.

Referring now to FIG. 15, there is illustrated a cross-sectional view of the integrated circuit 50 after one of the gate electrodes 88 is formed thereon. The gate electrode 88 extends across one of the narrow trench isolation structures 78, which preferably is the narrow trench isolation structures 78 depicted in FIG. 14. In a region 92, where the gate electrode 88 is adjacent to the narrow trench isolation structure 78, the problem of the prior art in which gate oxide layers are thinned at the squared outer corners of trenches is avoided with the gate oxide 86 by providing the convex profile of the outer corners 66 by the process described hereinabove with reference to FIGS. 9 and 10. In the regions 92 where the gate oxide layer 86 crosses the outer corners 66 of the trench isolation structure 78, the gate oxide layer 86 is thicker than if squared trench corners were used. It is also thicker due to the trench fill layer 76 that overlies the corner. This overlay is optional, depending upon the initial amount of overlap, the etch rate and the amount of etch. Another advantage of the present embodiment is that the electric field concentrations will be minimized by the rounded, convex shape of the outer corners 66 of the trench 60.

Figure 16:
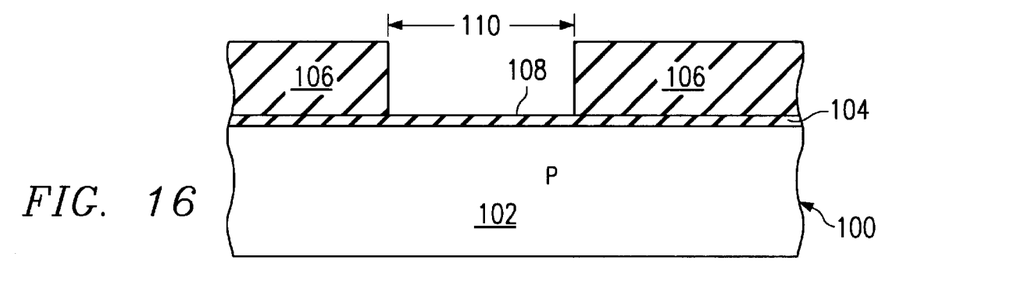
FIG. 16 illustrates a cross-sectional view of a third partially fabricated integrated circuit after a pad oxide and nitride mask have been formed thereon.

Referring now to FIG. 16, there is illustrated a cross-sectional view of a partially fabricated integrated circuit 100. The circuit 100 is fabricated to the point depicted in FIG. 16 by processing in a similar fashion to the partially fabricated integrated circuit 10 depicted in FIG. 1 such that, as illustrated, a P-type substrate 102 is provided with a pad oxide 104 layer. A nitride layer is deposited, and then patterned and etched to define a nitride mask 106 on the pad oxide layer 104, to provide a window 110 of a minimum spacing according to photolithography limitations. An isolation trench region 108 is then defined in the space defined in the window 110 between the mask mesas of the nitride mask 106.

Figure 17:
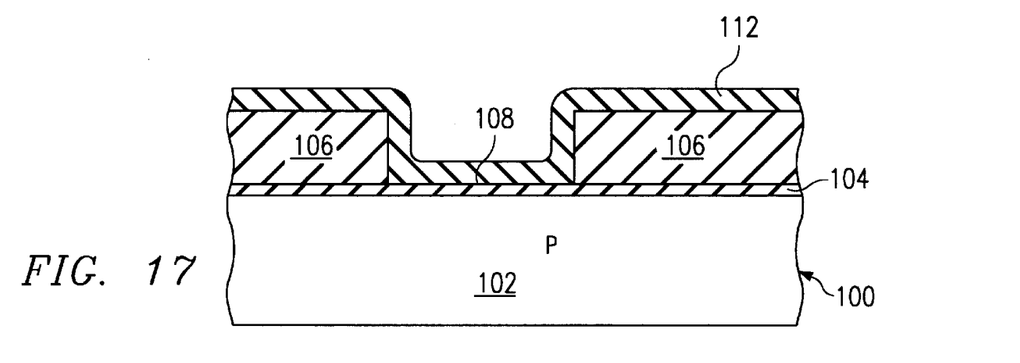
FIG. 17 illustrates a cross-sectional view of the third integrated circuit after a conformal nitride layer has been formed thereon.

Referring now to FIG. 17, there is illustrated a cross-sectional view of the partially fabricated integrated circuit 100. A conformal nitride layer 112 is deposited on the upper surface of the nitride mask 106 and on top of the portion of the pad oxide 104 which extends within the isolation trench region 108 of the open window 110 of the nitride mask layer 106.

Figure 18:
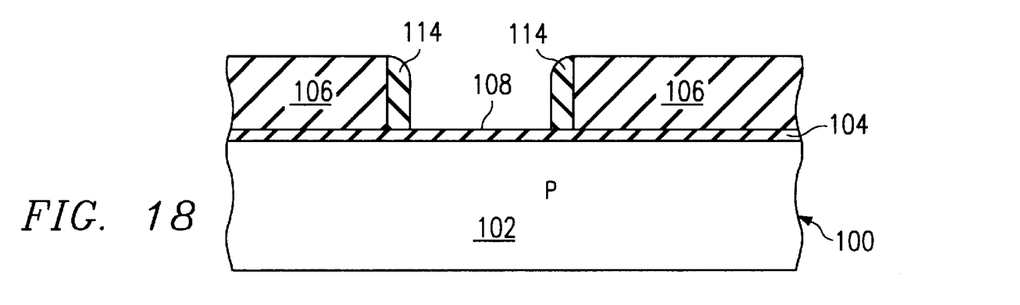
FIG. 18 illustrates a cross-sectional view of the third integrated circuit after an anisotropic etch to form nitride sidewalls on the sidewalls of the nitride mask.

Referring now to FIG. 18, there is illustrated a cross-sectional view of the partially fabricated integrated circuit 100 after further processing to provide nitride sidewall spacers 114. The nitride layer 112 is exposed to an anisotropic etch to etch the substantially horizontal surfaces of the nitride layer 112 and leave the nitride sidewall spacers 114 on the vertical surfaces of the layer 106. The nitride sidewall spacers 114 are disposed such that they are spaced within the window 110 on opposite sides of the trench region 108 from one another and laterally adjacent to the sides of the nitride mask 106. Preferably, the nitride sidewall spacers 114 will extend laterally aside from the sidewalls of the nitride mask layer 106 for a thickness of 100 to 500 Angstroms, such that the space between the two nitride spacers 114 depicted in FIG. 18 will be approximately equal to the difference between the spacing 110 and the combined thicknesses of both of the nitride spacers 114.

Figure 19:
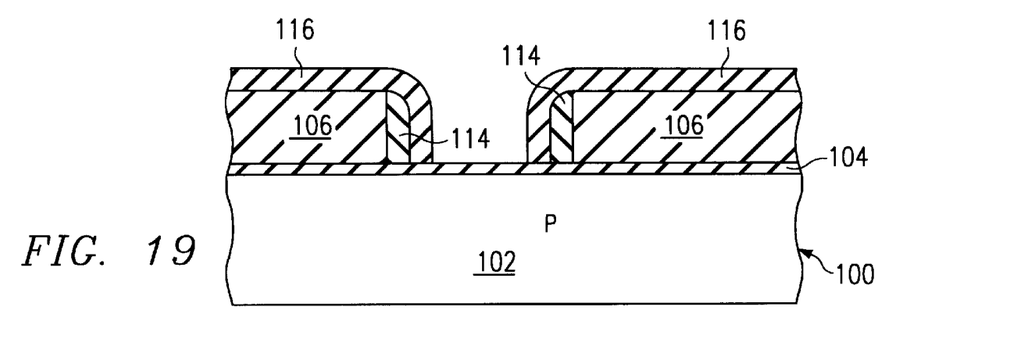
FIG. 19 illustrates a cross-sectional view of the third integrated circuit after forming a conformal oxide layer thereon.

Referring now to FIG. 19, there is illustrated a cross-sectional view of the partially fabricated integrated circuit 100. A conformal oxide layer 116 has been deposited upon the nitride mask 106, adjacent to the nitride sidewall spacers 114, and above the portion of the pad oxide 104 which extends between adjacent ones of the nitride sidewall spacers 114. The conformal layer of the oxide is deposited by LPCVD techniques.

Figure 20:
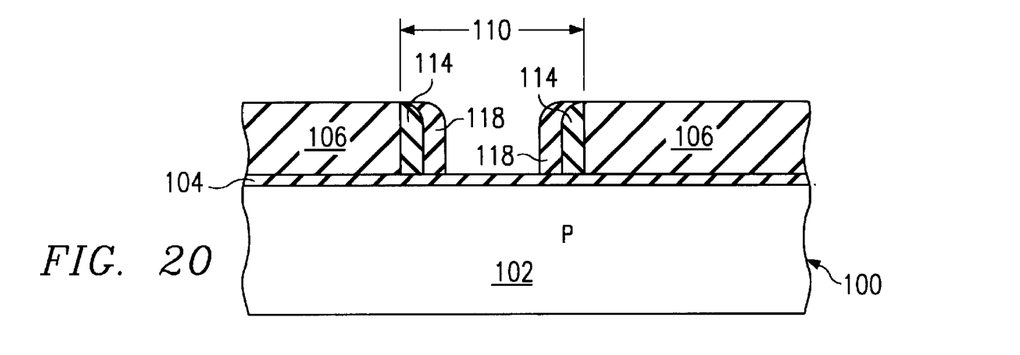
FIG. 20 illustrates a cross-sectional view of the third integrated circuit after an anisotropic etch to form oxide sidewalls on the nitride sidewalls disposed on the sidewalls of the nitride mask.

Referring now to FIG. 20, there is illustrated a cross-sectional view of the partially fabricated integrated circuit 100. The oxide layer 116 has been exposed to an anisotropic etch to provide the oxide sidewall spacers 118 according to the process described above for the sidewall spacers 24 in reference to FIG. 3. The sidewall spacers 118 are spaced apart and laterally adjacent to the nitride sidewall spacers 114, on opposite sides of the nitride sidewall spacers 114 and the nitride mask 106. Preferably, the oxide sidewall spacers 118 extend laterally aside of the nitride sidewall spacers 114 for a thickness of approximately 100 to 500 microns, such that the width of the spacing between the adjacent ones of the oxide sidewall spacers 118 depicted in FIG. 20 is approximately equal to the difference between the spacing 110, and the sum of the combined thicknesses of the adjacent ones of the oxide sidewall spacers 118 and the combined thicknesses of the nitride sidewall spacers 114.

Figure 21:
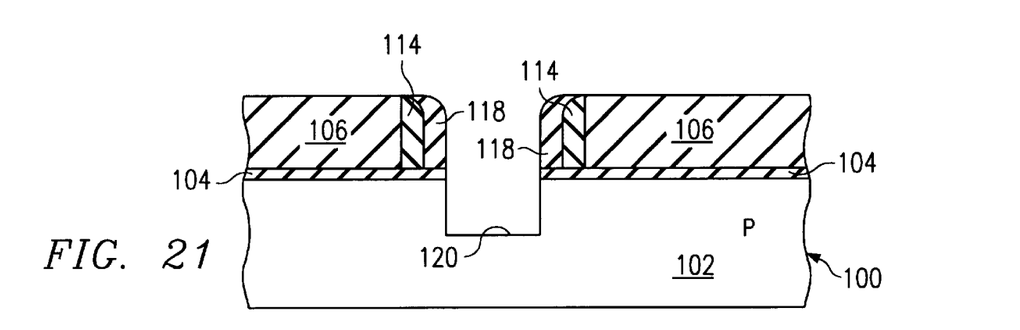
FIG. 21 illustrates a cross-sectional view of the third integrated circuit after a trench etch has been performed to form an isolation trench therein.

Referring now to FIG. 21, there is illustrated a cross-sectional view of the partially fabricated integrated circuit 100 during the fabrication process. A trench etch is performed on the substrate to remove the portion of the pad oxide 104 which extends between adjacent ones of the oxide sidewall spacers 118, and to etch a trench 120. Preferably, the trench 120 extends to a depth within the substrate 102 of approximately one-half micron.

Figure 22:
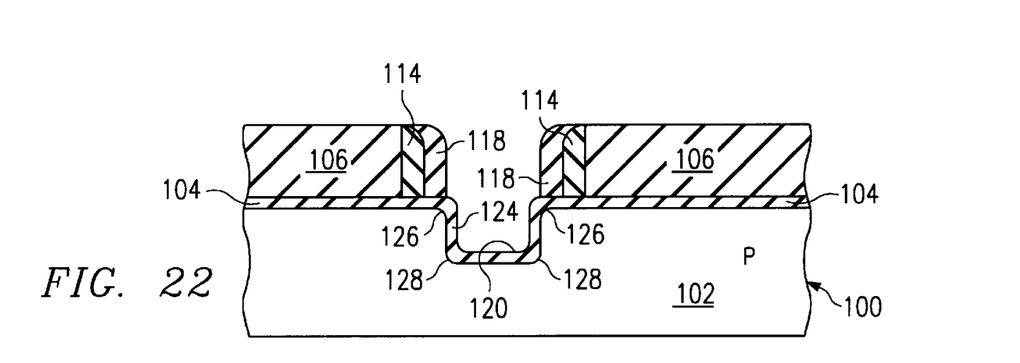
FIG. 22 illustrates a cross-sectional view of the third integrated circuit after forming a layer of oxide on the exposed surfaces of the substrate of the third integrated circuit.

Referring now to FIG. 22, there is illustrated a cross-sectional view of the partially fabricated integrated circuit 100. A thin oxide layer 124 has been grown on the sidewalls and on the bottom surfaces of the trench 120, consuming a portion of the substrate 102 at corners 126 of the trench 120, such that the corners 126 are rounded to have profiles with a smoothly rounded, convex exterior shape. In other embodiments, the corners 126 of the trench 120 may remain squared, such as that shown for substrate 10 of FIGS. 5–8.

Figure 23:
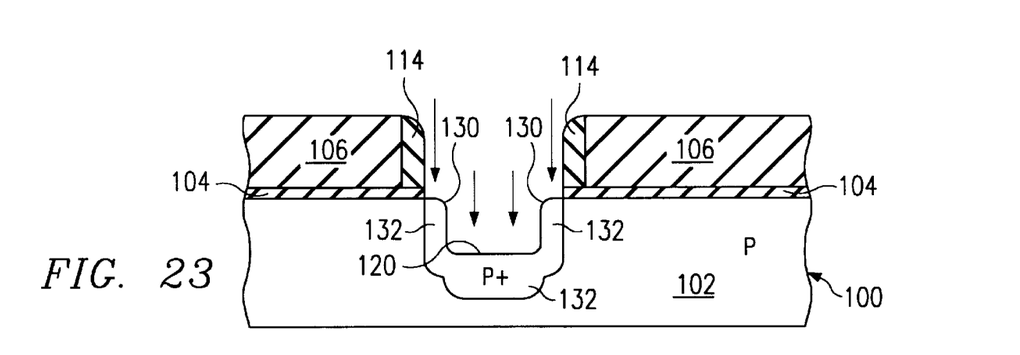
FIG. 23 illustrates a cross-sectional view of the third integrated circuit as channel stops are being implanted into a regions of the substrate of the third integrated circuit which are adjacent to the trench.

Referring now to FIG. 23, there is illustrated a cross-sectional view of the partially fabricated integrated circuit 100 during the fabrication process. The oxide layer 124 is removed from within the trench 120 and the corners 126 of the substrate 102. This etching process also removes the oxide sidewall spacers 118 to expose ledges 130 which extend as shelves disposed laterally aside of the nitride sidewall spacers 114 and adjacent to the trench 120. The etch is an oxide selective etch and, therefore, the nitride sidewall spacers 114 remain in place. Channel stops 132 are implanted into the portions of the substrate 102 which extend adjacent to the sidewalls and lower portion of the trench 120. Optionally, an oxide (not shown) is formed on the surfaces prior to implant of the channel stops 132. Preferably, boron is ion implanted into the surface of the ledges 130, the sidewalls and the bottom of the trench 120 as described above for channel stops 30 in reference to FIG. 5. In an alternate embodiment, the oxide spacers can be removed and then sidewall oxide layers are grown, which consumes silicon and rounds the corners. The channel stop implant is then performed through the grown oxide.

Figure 24:
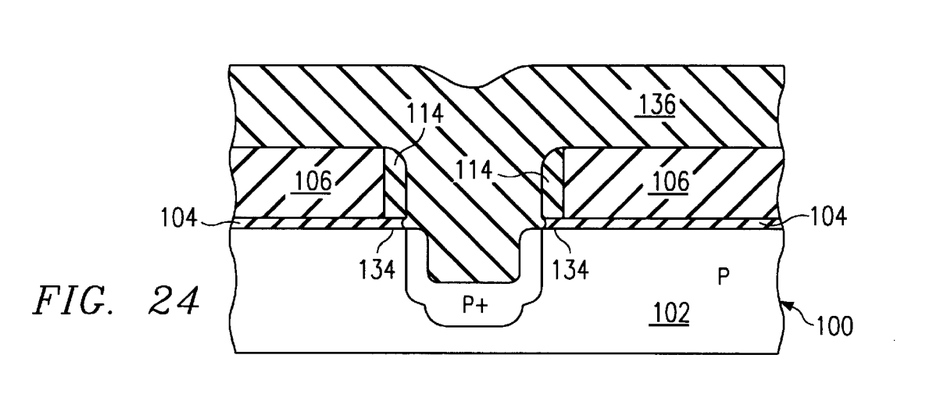
FIG. 24 illustrates a cross-sectional view of the third integrated circuit after a layer of oxide has been formed thereon.

Referring now to FIG. 24, there is illustrated a cross-sectional view of the partially fabricated integrated circuit 100 during the fabrication process. An oxide layer 136 has been deposited upon the integrated circuit 100, preferably by an LPCVD process. Also, it is preferable to grow an oxide layer prior to this deposition process. It should be noted that in other embodiments, the nitride sidewall spacers 114 could be removed by conventional photolithography techniques or by a timed isotropic etch prior to depositing the layer 136 upon the partially fabricated integrated circuit 100.

Figure 25:
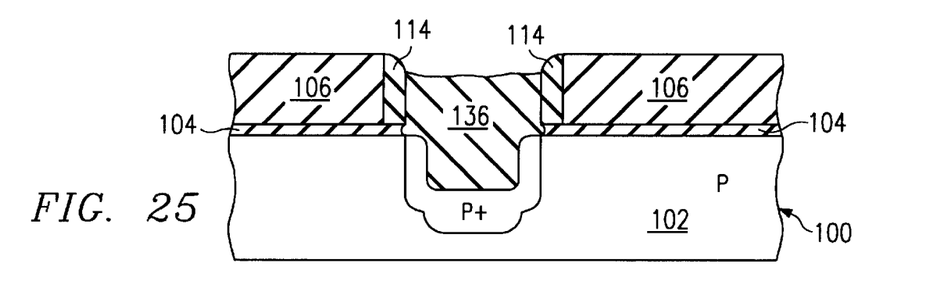
FIG. 25 illustrates a cross-sectional view of the third integrated circuit after being polished according to a CMP process.

Referring now to FIG. 25, there is illustrated a cross-sectional view of the partially fabricated integrated circuit 100 during the fabrication process. After deposition of the oxide layer 136, the top portion of the integrated circuit 100 is preferably exposed to a CMP process to remove a portion of the oxide layer 136 and expose the nitride mask layer 106. Then, the nitride mask layer 106, the nitride sidewall spacers 114, and the pad oxide 104 are removed from the integrated circuit 100.

Figure 26:
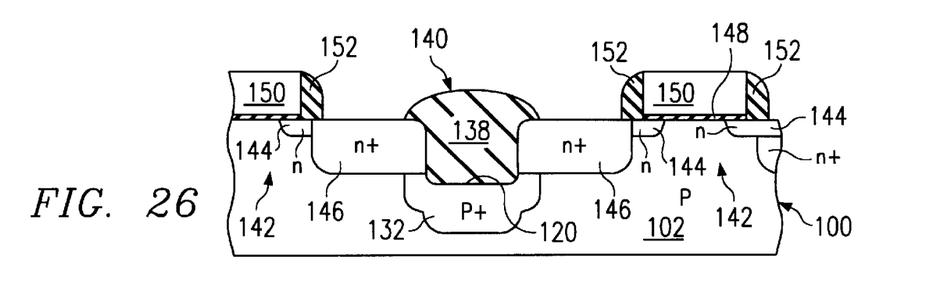
FIG. 26 illustrates a cross-sectional view of the third integrated circuit after the nitride sidewall spacers, the nitride mask and the pad oxide have been removed, and transistors have been formed in the active regions thereof.

Referring now to FIG. 26, there is illustrated a cross-sectional view of the partially fabricated integrated circuit 100 during the final stages of the fabrication process. Further processing the integrated circuit 100 has resulted in a plug 138 of oxide being formed of the oxide layer 136. A narrow trench isolation structure 140 is thus defined by the oxide plug 138 which is disposed in the trench 120 and the channel stops 132 which are adjacent to the trench 120. The narrow trench isolation structure 140 extends between the active regions 142 of the partially fabricated integrated circuit 100. Source/drain implants 144 and 146 are then implanted into the substrate 102 by the self-aligned processing technique discussed above in reference to FIG. 8. First, a gate oxide layer 148 is formed on the surface of the substrate 102, followed by forming gate electrodes 150 of polysilicon. Then the LDD implants 144 are formed, followed by the formation of sidewall spacers 152 on the gate electrodes 150. Source/drain implants 146 are then formed.

Figure 27:
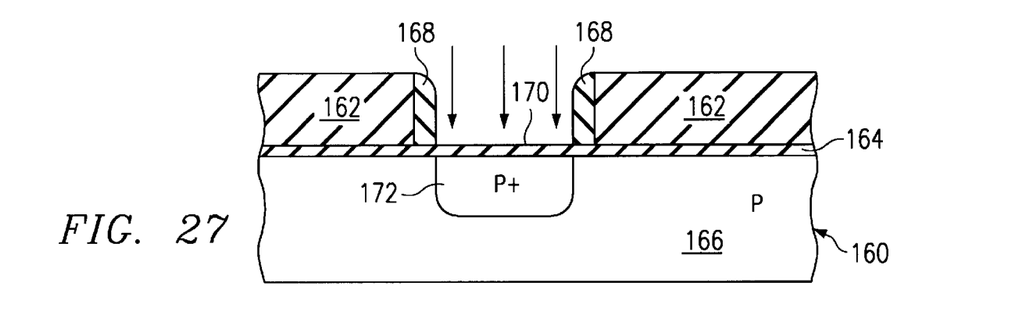
FIG. 27 illustrates a cross-sectional view of a fourth partially fabricated integrated circuit after a pad oxide and a nitride mask have been formed thereon, with nitride sidewall spacers formed on the sidewalls of spaces in the nitride mask, and then a channel stop region being formed in the exposed portion of the substrate.

Referring now to FIG. 27, there is illustrated a cross-sectional view of a partially fabricated integrated circuit 160 during the fabrication process. Integrated circuit 160 has a nitride mask 162 formed thereon. A pad oxide 164 has previously been formed on the substrate 166. Sidewall spacers 168 are formed on the sidewalls of the mask 162. The sidewall spacers 168 may be formed of nitride or oxide. A channel stop is then implanted into the region 170 which extends between the sidewall spacers 168. This creates a portion of the substrate 166 having a p+ region 172.

Figure 28:
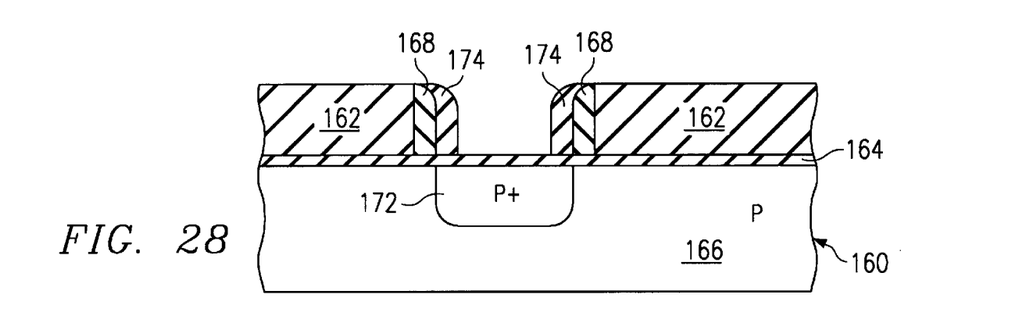
FIG. 28 illustrates a cross-sectional view of a substrate of the fourth integrated circuit during the fabrication process after a second set of sidewall spacers are formed on the first sidewall spacers.

Referring now to FIG. 28, there is illustrated a cross-sectional view of the substrate 160 during the fabrication process. Sidewall spacers 174 have been formed on the sides of the sidewall spacers 168. Sidewall spacers 174 may be formed of nitride or oxide.

Figure 29:
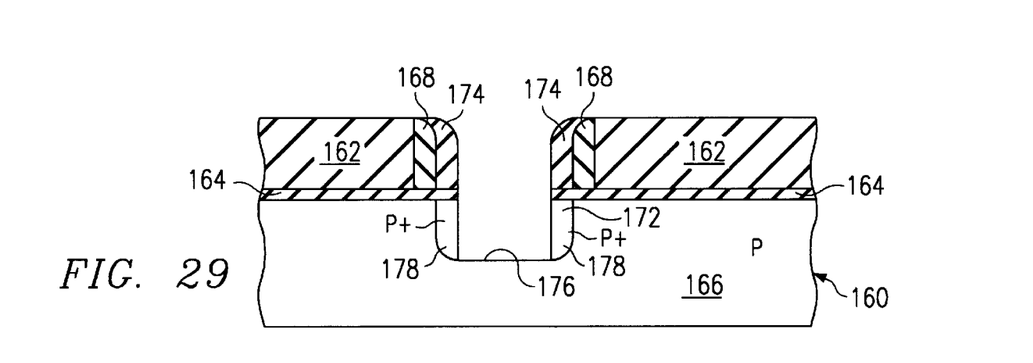
FIG. 29 illustrates a cross-sectional view of the fourth integrated circuit during the fabrication process after a trench has been etched into the exposed portions of the substrate.

Referring now to FIG. 29, there is illustrated a cross-sectional view of the integrated circuit 160 during the fabrication process. The region of the pad oxide 164 and the substrate 166 which is disposed adjacent to the space between adjacent ones of the sidewall spacers 174 has been removed by a trench etch process to provide trench 176. The trench 176 extends through at least a portion of the doped region 172 of the substrate 166, such that channel stops 178 are provided on opposite sides of the trench 176. It should be noted that if the spacing of the mask 162 is formed at the minimum photolithographic spacing limit, then preferably the entire isolation structure defined by the trench 176 and the channel stops 172 will be disposed such that they have a width which is significantly less than that of the photolithographic spacing limit. The width of the trench 176 between the sidewall spacers 168 and 174 may typically be approximately 50 nanometers wide, for current lithographic limits. If nitride is used to provide the sidewall spacers 168, 174, then an undercut etch may be performed into the pad oxide 164 to round the corners of the substrate 166 adjacent the trench 176, and an oxide may also optionally be grown to further round the corners into a convex shape.

Figure 30:
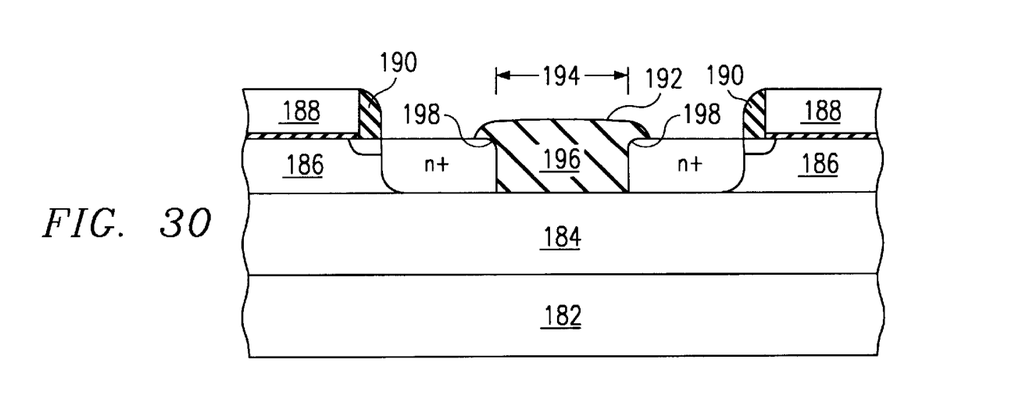
FIG. 30 illustrates a cross-sectional view of a silicon on insulator integrated circuit made according to the present invention.

Referring now to FIG. 30, there is illustrated a cross-sectional view of a partially completed integrated circuit 180 made according to the present invention. Integrated circuit 180 is a silicon-on-insulator type integrated circuit having a substrate 182, an insulator layer 184 and a device layer 186. As depicted in FIG. 30, the insulator layer 184 is disposed relative to the substrate 182 and device layer 186, such that insulator layer 184 is a buried insulator layer formed between substrate 182 and device layer 186, utilizing conventional techniques. Silicon device active regions are formed in the device layer 186, disposed upon the insulator layer 184. Gate oxides and gates 188 are formed above the device layers 186. Sidewall spacers 190 are disposed on opposite sides of the gates 188. As depicted in FIG. 30, an isolation region 192 of a width 194 has been etched through the device layer 186 to form mesa regions in the device layer 186. The space between mesa regions 192 is filled with a dielectric plug 196. The isolation region 192 can be formed with any of the previously described embodiments of the current invention, including use of single or double spacers on the isolation masking layer, optional use of an oxide spacer or use of an undercut etch to enhance rounding of corners 198, and optional use of channel stop implant in the edges of the mesa regions.

The present invention provides several advantages over prior art trench isolation structures and methods for fabricating such trench isolation structures. A dual set of sidewall spacers are provided prior to etching an isolation trench such that the width of the region in which the trench is formed is significantly reduced beneath the minimum spacing of conventional photolithographic techniques, and the width reduction and channel stop width can be set independently. This provides a more narrow trench isolation structure than could be achieved using conventional photolithographic techniques, such that the spacing between active regions is reduced, allowing the active regions of transistors and other components disposed adjacent to the narrow trench isolation structures to have larger active regions for integrated circuits of particular component densities. Additionally, the corners of the trench isolation structure are preferably rounded to avoid the problem of thinning gate oxides where the gates pass across and adjacent to the narrow trench isolation structures. Further, narrow trench isolation structures which include channel stops in the moat edge have improved electrical isolation along the transistor edge.

Although the preferred and alternative embodiments have been described in detail, it should be understood that various changes, substitutions and alterations can be made therein without departing from the spirit and scope of the invention as defined by the appended claims. For example, different combinations of materials can be utilized for the patterning of the mesa and the formation of the sidewalls. Similarly, different materials can be used for filling the trench. This can also apply to SOI technology wherein the trench is formed through the device silicon layer to the Buried Oxide (BOX). The transistor structure included in the description are illustrative and are not intended to be restrictive.

What is claimed is:

1. A method for fabricating an integrated circuit, comprising the steps of:

forming an etch mask with photolithographic equipment on a substrate having spaced apart sidewalls in the etch mask;

forming first spaced apart sidewall spacers on the sidewalls of the etch mask;

forming second spaced apart sidewall spacers on the sidewall of the first sidewall spacers, the second sidewall spacers being of different material than the first sidewall spacers; and forming a trench into the substrate in the space between adjacent ones of the second sidewall spacers.

2. The method of claim 1, wherein the space between the second sidewall spacers being less than the practical lithographic limit for the photolithographic equipment being used.

3. A method for fabricating an integrated circuit, comprising the steps of:

forming an etch mask on a substrate having spaced apart sidewalls in the etch mask;

forming spaced apart sidewall spacers on the sidewalls of the etch mask;

forming a trench into the substrate in the space between adjacent ones of the sidewall spacers;

removing the sidewall spacers;

implanting channel stops into portions of the substrate which are adjacent to the trench and into the bottom of the trench;

disposing a dielectric within the trench, between the portions of the substrate in which the channel stops are formed; and removing the etch mask;

wherein the step of forming spaced apart, sidewall spacers comprises forming at least two sidewall spacers on the sidewalls of the etch mask.

4. The method according to claim 3, wherein the sidewall spacers are formed of silicon dioxide.

5. The method according to claim 3, further comprising the steps of:

after the step of forming the trench into the substrate, undercut etching a pad oxide disposed beneath at least part of the sidewall spacers to expose the outward corners of the substrate which are adjacent to the trench; and growing an oxide layer upon the outward corners of the substrate adjacent to the trench, such that the peripheral edges of the outward corners are consumed to provide the outward corners with exterior profiles having a convex shape.

6. The method according to claim 3, wherein the step of forming the spaced apart, sidewall spacers comprises forming only one of the sidewall spacers on each of the sidewalls of the etch mask.

7. The method according to claim 3, wherein the sidewall spacers are formed of silicon nitride.

8. The method according to claim 7, and further comprising the step of:

growing a silicon oxide on the outward corners of the substrate which are adjacent to the trench, such that the peripheral edges of the corners are consumed to provide the outward corners with the exterior profiles having a convex shape.

9. The method according to claim 7, and further comprising the step of:

performing an undercut etch beneath at least part of the sidewall spacers to consume the outward corners of the substrate adjacent to the trench, such that the peripheral edges of the outward corners are rounded to have exterior profiles with a convex shape.

10. The method according to claim 9, and further comprising the step of:

growing a silicon oxide on the outward corners of the substrate which are adjacent to the trench, such that the peripheral edges of the outward corners are consumed to further round the outward corners with the exterior profiles having a convex shape.

11. The method according to claim 3, wherein the outermost sidewall spacers are formed of silicon nitride.

12. The method according to claim 11, and further comprising the step of:

growing a silicon oxide on the outward corners of the substrate which are adjacent to the trench, such that the peripheral edges of the outward corners are consumed to provide the outward corners with exterior profiles having a convex shape.

13. The method according to claim 11, and further comprising the step of:

performing an undercut etch beneath at least part of the sidewall spacers to consume the outward corners of the substrate adjacent to the trench, such that the peripheral edges of the outward corners are consumed to provide the outward corners with exterior profiles having a convex shape.

14. The method according to claim 13, and further comprising the step of:

growing a silicon oxide on the outward corners of the substrate which are adjacent to the trench, such that the peripheral edges of the outward corners are consumed to further round the outward corners with the exterior profiles having a convex shape.

15. A method for fabricating an integrated circuit comprising the steps of:

forming an etch mask on the substrate having spaced apart sidewalls in the etch mask;

forming first sidewall spacers on the sidewalls of the etch mask;

forming second sidewall spacers laterally adjacent to the first sidewall spacers, on opposite sides of the first sidewall spacers from the sidewalls of the etch mask;

forming trenches into the substrate in spaces between adjacent ones of the second sidewall spacers;

disposing a dielectric material within the trenches; and removing the etch mask, and the first and second sidewall spacers.

16. The method according to claim 15, wherein the first and second sidewall spacers are removed after the step of disposing the dielectric material within the trench.

17. The method according to claim 15, and further comprising the step of:

performing an undercut etch beneath at least part of the sidewall spacers to consume the outward corners of the substrate adjacent to the trench, such that the peripheral edges of the outward corners are consumed to provide the outward corners with exterior profiles having a convex shape.

18. The method according to claim 15, wherein:

the step of forming the first sidewall spacers comprises depositing a first conformal layer of silicon nitride and then applying a first anisotropic etch to the first conformal layer of silicon nitride; and the step of forming the second sidewall spacers comprises depositing a second conformal layer of silicon nitride and then applying a second anisotropic etch to the second conformal layer of silicon nitride.

19. The method according to claim 18, and further comprising the steps of:

after the step of forming the trench into the substrate, performing an undercut etch of a pad oxide disposed beneath the second sidewall spacers to expose the outward corners of the substrate which are adjacent to the trench; and growing an oxide layer upon the outward corners of the substrate adjacent to the trench such that the peripheral edges of the outward corners are consumed to provide the outward corners with exterior profiles having a convex shape.

20. The method according to claim 18, and further comprising the step of:

after the step of forming the trench into the substrate, performing an undercut etch of the pad oxide to round the outward corners of the substrate which are adjacent to the trench.

21. The method according to claim 15, wherein the etch characteristics of the first sidewall spacers and the second sidewall spacers are different.

22. The method of claim 15, wherein the etch mask has etch properties and the etch properties of the sidewall spacers differ from the etch properties of the etch mask.

23. A method for fabricating an integrated circuit, comprising the steps of:

forming an etch mask on a substrate having spaced apart sidewalls in the etch mask;

forming first spaced apart, sidewall spacers on the sidewalls of the etch mask;

implanting a dopant into portions of the substrate which are adjacent to the first sidewall spacers and which extend between the adjacent ones of the first sidewall spacers;

forming second spaced apart, sidewall spacers on the sides of the first sidewall spacers, on an opposite side of the first sidewall spacers from the etch mask;

forming a trench between adjacent ones of the second sidewall spacers and into the portions of the substrate having the dopant implanted therein, such that channel stops are defined in the regions of the substrate adjacent to the trench;

disposing a dielectric within the trench, between the portions of the substrate in which the channel stops are defined; and removing the etch mask.

24. The method according to claim 23, further comprising the steps of:

after the step of forming the trench into the substrate, removing the second sidewall spacers to expose the outward corners of the substrate which are adjacent to the trench; and growing an oxide layer upon the outward corners of the substrate adjacent to the trench, such that the peripheral edges of the outward corners are consumed to provide the outward corners with exterior profiles having a convex shape.

25. The method according to claim 23, and further comprising the step of:

performing an undercut etch beneath at least part of the second sidewall spacers to consume the outward corners of the substrate adjacent to the trench, such that the peripheral edges of the outward corners are consumed to provide the outward corners with exterior profiles having a convex shape.

26. The method according to claim 25, and further comprising the step of:

growing a silicon oxide on the outward corners of the substrate which are adjacent to the trench, such that the peripheral edges of the corners are consumed to further round the outward corners with the exterior profiles having a convex shape.

27. A method for fabricating an integrated circuit comprising the steps of:

forming a pad oxide layer on a substrate;

forming a nitride layer on the pad oxide layer;

removing a portion of the nitride layer by patterning and etching the nitride layer to provide a nitride mask having spaced apart sidewalls of windows of the nitride mask;

forming nitride sidewall spacers on the sidewalls of the nitride mask;

forming oxide sidewall spacers laterally adjacent to the nitride sidewall spacers, on opposite sides of the nitride sidewall spacers from the sidewalls of the nitride mask;

forming trenches into the substrate in spaces defined between spaced apart, adjacent ones of the oxide sidewall spacers;

removing the oxide sidewall spacers to expose shelf regions of the substrate adjacent to the trenches;

implanting channel stops into the shelf regions of the substrate which are adjacent to the trenches;

disposing a dielectric within the trenches, extending between the shelf regions of the substrate in which the channel stops are formed; and removing the nitride sidewall spacers, the nitride layer and the pad oxide layer.

28. The method according to claim 27, wherein the nitride sidewall spacers are removed after the step of disposing the dielectric material within the trenches.

29. The method according to claim 27, further comprising the steps of:

after the step of forming the trenches into the substrate, growing an oxide layer upon the corners of the substrate adjacent to the trenches such that the peripheral edges of the corners are consumed to provide the outward corners with exterior profiles having a convex shape; and removing the grown oxide layer to expose the outer corners of the substrate which are adjacent to the trenches.

* * * * *